(12) United States Patent
Kanae

(10) Patent No.: US 10,312,880 B2
(45) Date of Patent: Jun. 4, 2019

(54) METHOD FOR MANUFACTURING ELECTRONIC COMPONENT MODULE

(71) Applicant: Murata Manufacturing Co., Ltd., Nagaokakyo-shi, Kyoto-fu (JP)

(72) Inventor: Masaaki Kanae, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 174 days.

(21) Appl. No.: 15/410,932

(22) Filed: Jan. 20, 2017

(65) Prior Publication Data

US 2017/0133995 A1 May 11, 2017

Related U.S. Application Data

(60) Division of application No. 14/027,674, filed on Sep. 16, 2013, now Pat. No. 9,590,586, which is a (Continued)

(30) Foreign Application Priority Data

Mar. 22, 2011 (JP) .................................. 2011-062748

(51) Int. Cl.
*H03H 3/08* (2006.01)
*H03H 9/05* (2006.01)
(Continued)

(52) U.S. Cl.
CPC .............. *H03H 3/08* (2013.01); *H03H 3/007* (2013.01); *H03H 3/02* (2013.01); *H03H 9/05* (2013.01);
(Continued)

(58) Field of Classification Search
CPC ....... H01L 41/04; H01L 41/047; H01L 41/22; H03H 3/007; H03H 3/02; H03H 3/08;
(Continued)

(56) References Cited

U.S. PATENT DOCUMENTS

2009/0160290 A1* 6/2009 Tsuda ...................... H03H 9/059
310/313 C

FOREIGN PATENT DOCUMENTS

JP 2006-352430 * 12/2006

OTHER PUBLICATIONS

Kanae, "Electronic Component Module", U.S. Appl. No. 14/027,674, filed Sep. 16, 2013.

* cited by examiner

*Primary Examiner* — Carl J Arbes
(74) *Attorney, Agent, or Firm* — Keating & Bennett, LLP

(57) ABSTRACT

A method for producing an electronic component module prevents a space from collapsing. The method includes a step of preparing an electronic component including an element substrate, a drive device formed on a principal surface of the element substrate, and a protection device covering the drive device so as to form a space around the drive device; a step of fixing the electronic component on a common substrate such that a principal surface of the common substrate and another principal surface of the element substrate face each other; a step of fixing a reinforcing plate on the protection device of the electronic component; and a step of forming a resin layer on the principal surface of the common substrate such that the electronic component is contained therein.

16 Claims, 4 Drawing Sheets

Related U.S. Application Data continuation of application No. PCT/JP2012/054574, filed on Feb. 24, 2012.

(51) Int. Cl.
  *H03H 9/10* (2006.01)
  *H03H 3/007* (2006.01)
  *H03H 3/02* (2006.01)

(52) U.S. Cl.
  CPC ........ *H03H 9/0542* (2013.01); *H03H 9/1014* (2013.01); *H03H 9/1057* (2013.01); *H03H 9/1071* (2013.01); *Y10T 29/42* (2015.01); *Y10T 29/49128* (2015.01)

(58) Field of Classification Search
  CPC ...... H03H 9/05; H03H 9/0542; H03H 9/1014; H03H 9/1057; H03H 9/1071; Y10T 29/42; Y10T 29/49128
  See application file for complete search history.

METHOD FOR MANUFACTURING ELECTRONIC COMPONENT MODULE

BACKGROUND OF THE INVENTION

1. Field of the Invention

The present invention relates to an electronic component module including an electronic component, such as a SAW (surface acoustic wave) element or a BAW (bulk acoustic wave) element, contained in a resin layer.

2. Description of the Related Art

As an electronic component such as an existing SAW (surface acoustic wave) element or BAW (bulk acoustic wave) element, for example, an electronic component described in Japanese Unexamined Patent Application Publication No. 2009-159124 is known. In the electronic component, as shown in FIG. 6, a drive device 112 is provided on a piezoelectric substrate 110. In addition, vibration protection films 116 and 118 are formed around the drive device 112. The vibration protection films 116 and 118 serve to protect the drive device 112.

Furthermore, a space 138 is formed by a protection device 130. The space 138 is provided so as to ensure a space when an elastic wave or an acoustic wave propagates. The protection device 130 is composed of a first protection film 132, a second protection film 134, and a third protection film 136.

Meanwhile, when the electronic component in Japanese Unexamined Patent Application Publication No. 2009-159124 is mounted, the space may be collapsed. In other words, when an electronic component module including the electronic component is produced, after the electronic component is mounted on a common substrate, a resin layer is formed so as to cover the electronic component. When the resin layer is formed by means of molding, relatively-high pressure is applied to resin. Thus, depending on the resin, there is a concern that the protection device is deformed and the space is collapsed.

SUMMARY OF THE INVENTION

In view of the above-described problems, preferred embodiments of the present invention provide a method for manufacturing an electronic component module and an electronic component module in which a space is prevented from collapsing.

A method for manufacturing an electronic component module according to a preferred embodiment of the present invention includes a step of preparing an electronic component including an element substrate, a drive device located on a principal surface of the element substrate, and a protection device arranged to define a space around the drive device and covering the drive device; a step of preparing a common substrate, and mounting and fixing the electronic component on the common substrate by using a mounter such that a principal surface of the common substrate and another principal surface of the element substrate face each other; a step of mounting and fixing a reinforcing plate on the protection device of the electronic component by using a mounter; and a step of forming a resin layer on the principal surface of the common substrate such that the electronic component is contained therein.

In the method for manufacturing the electronic component module according to a preferred embodiment of the present invention, in the step of fixing the reinforcing plate, preferably, an adhesive layer is previously formed on a surface of the reinforcing plate, and the reinforcing plate is fixed such that the adhesive layer is located between the protection device and the reinforcing plate.

In the method for manufacturing the electronic component module according to a preferred embodiment of the present invention, the reinforcing plate is preferably made of Si.

In the method for manufacturing the electronic component module according to a preferred embodiment of the present invention, preferably, the element substrate is a piezoelectric substrate and the drive device includes an interdigital transducer electrode.

In the method for manufacturing the electronic component module according to a preferred embodiment of the present invention, preferably, the element substrate is an insulating substrate and the drive device includes a piezoelectric thin film on both surfaces of which electrodes are formed.

In the method for manufacturing the electronic component module according to a preferred embodiment of the present invention, preferably, the element substrate is an insulating substrate and the drive device includes a vibrating device made of Si.

According to another preferred embodiment of the present invention, an electronic component module includes a common substrate; an electronic component fixed on the common substrate, the electronic component including an element substrate, a drive device located on a principal surface of the element substrate, and a protection device arranged to define a space around the drive device and covering the drive device, the electronic component being mounted and fixed by using a mounter such that a principal surface of the common substrate and another principal surface of the element substrate face each other; a reinforcing plate mounted and fixed on the protection device of the electronic component by using a mounter; and a resin layer located on the principal surface of the common substrate so as to contain the electronic component therein.

In the electronic component module according to a preferred embodiment of the present invention, preferably, an adhesive layer is previously formed on the reinforcing plate and the reinforcing plate is fixed such that the adhesive layer is located between the protection device and the reinforcing plate.

In various preferred embodiments of the present invention, it is possible to prevent collapse of the space due to the presence of the reinforcing plate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be described.

First Preferred Embodiment

Figure 1A:
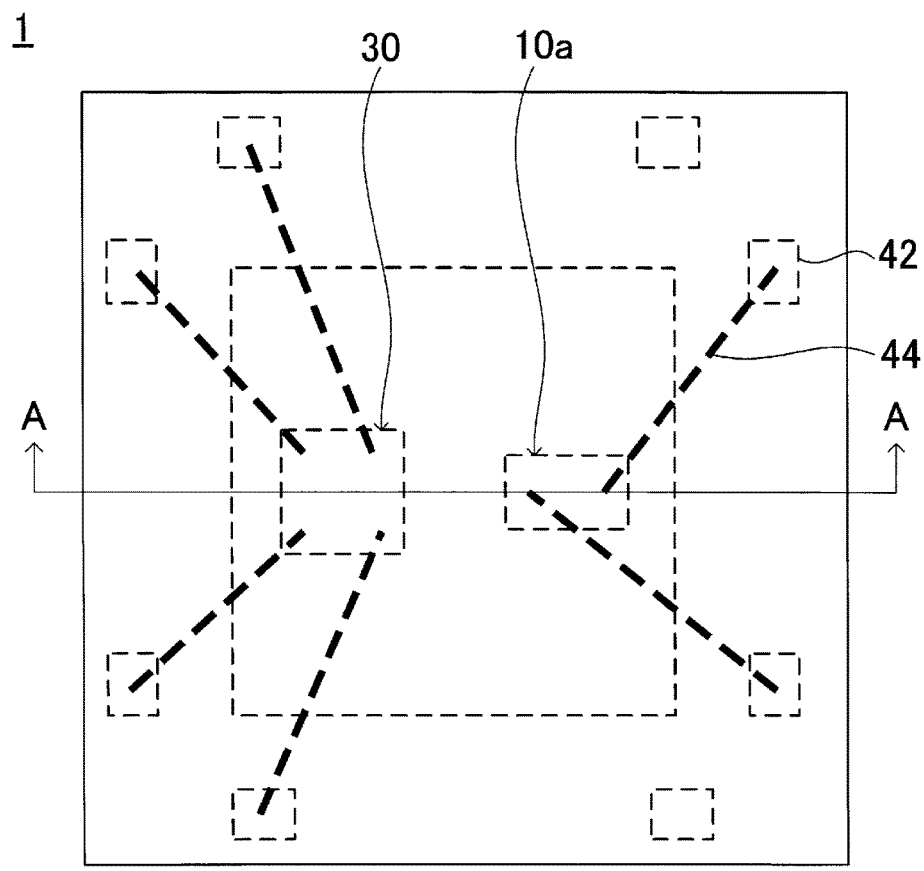
FIGS. 1A and 1B are a top view and a cross-sectional view showing an electronic component module according to a preferred embodiment of the present invention.
Figure 1B:
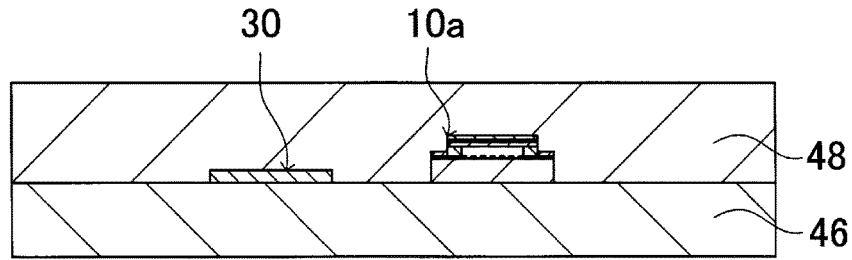

FIGS. 1A and 1B are a top view and a cross-sectional view showing an electronic component module according to a preferred embodiment of the present invention. FIG. 1A is a top view, and FIG. 1B is an A-A cross-sectional view of FIG. 1A.

An electronic component module 1 includes a common substrate 46, an electronic component 10a, and a resin layer 48. In the present preferred embodiment, the electronic component module 1 may include an IC element 30. The electronic component 10a and the IC element 30 are fixed on the common substrate 46. In addition, the resin layer 48 is arranged on a principal surface of the common substrate 46 so as to contain the electronic component 10a and the IC element 30 therein.

The electronic component 10a and the IC element 30 are electrically connected to lands 42 via wires 44. The lands 42 are provided to electrically connect the electronic component module 1 to an external circuit, and at least some of the lands 42 are exposed on a bottom surface of the electronic component module 1.

Next, a method for manufacturing the electronic component module according to a preferred embodiment of the present invention will be described with reference to cross-sectional views of FIGS. 2A-2C and 3D. The present preferred embodiment is an example where the electronic component 10a is a SAW element.

Figure 2A:
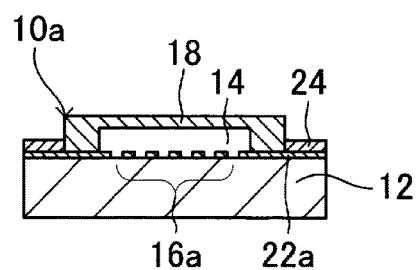
FIGS. 2A-2C are cross-sectional views showing a method for manufacturing the electronic component module according to a preferred embodiment of the present invention.

First, as shown in FIG. 2A, the electronic component 10a is prepared. The electronic component 10a includes an element substrate 12, a drive device 16a, a protection device 18, a wire 22a, and a terminal electrode 24.

In the present preferred embodiment, the element substrate 12 is a piezoelectric substrate. A surface acoustic wave propagates on a surface of the piezoelectric substrate. Examples of the material of the piezoelectric substrate include LiTaO$_3$ and the like.

The drive device 16a is located on a principal surface of the element substrate 12. In addition, in the present preferred embodiment, the drive device 16a includes an interdigital transducer electrode. Examples of the material of the interdigital transducer electrode include Al and the like.

The protection device 18 is arranged to define a space 14 around the drive device 16a, and covers the drive device 16a. The protection device 18 has, for example, a three-layer structure. In this case, first, a photosensitive polyimide resin is applied to the entirety of a principal surface of the piezoelectric substrate, such that a resin film is provided. Next, of the resin film, a portion covering the drive device 16a and the surrounding thereof is removed by a photolithographic technique. Next, a composite layer of a photosensitive polyimide resin and a sheet material is provided on the resin film.

The terminal electrode 24 is formed on the principal surface side of the element substrate 12. In addition, the wire 22a is provided so as to electrically connect the drive device 16a to the terminal electrode 24. It is preferred if the interdigital transducer electrode of the drive device 16a and the wire 22a are formed by the same process, since it is possible to produce them at a low cost. Examples of a method for forming the interdigital transducer electrode and the wire 22a include methods using a thin film process such as a sputtering method.

Figure 2B:
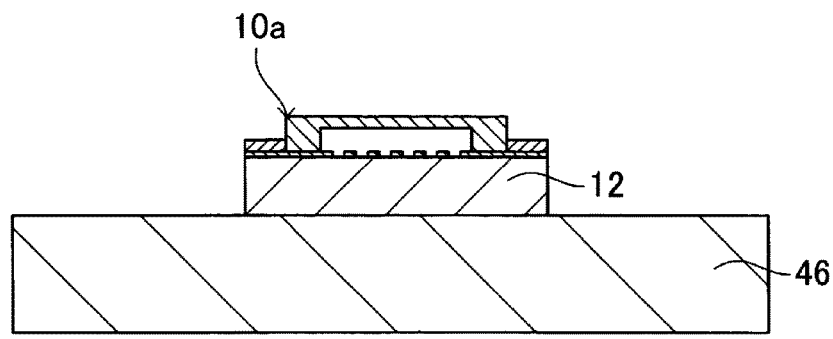

Next, as shown in FIG. 2B, the common substrate 46 is prepared, and the electronic component 10a is fixed on the principal surface of the common substrate 46. At that time, the electronic component 10a is fixed such that the principal surface of the common substrate 46 and another principal surface of the element substrate 12 face each other. First, the electronic component 10a is mounted on the common substrate 46 by using a mounter. At that time, the mounter retains the electronic component 10a that is previously disposed at a predetermined location, with a suction mechanism or the like. Then, the mounter transfers the electronic component 10a onto the common substrate 46 in a state of retaining the electronic component 10a. Then, the mounter releases the retention of the electronic component 10a and mounts the electronic component 10a on the common substrate 46.

If an adhesive layer is interposed between the common substrate 46 and the electronic component 10a, the adhesive layer may be previously provided on the common substrate 46, or may be provided on a surface of the electronic component 10a that faces the common substrate 46. Then, the electronic component 10a is fixed by a solidification process such as heating. Examples of the common substrate 46 include a printed circuit board and a lead frame.

Next, although not shown, the terminal electrode and a land are connected to each other via a wire through wire bonding.

Figure 2C:
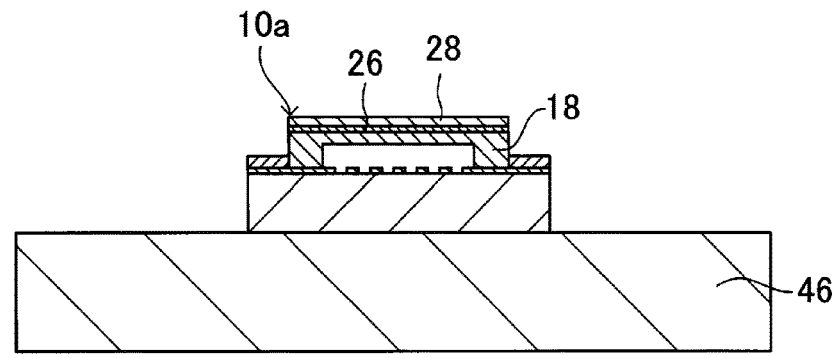

Next, as shown in FIG. 2C, a reinforcing plate 28 is fixed on the protection device 18 of the electronic component 10a.

In the present preferred embodiment, an adhesive layer 26 is previously formed on a surface of the reinforcing plate 28. In this case, it is unnecessary to individually form the adhesive layer 26 on the protection device 18, and thus it is possible to conduct the manufacture by a simpler process. Examples of the combination of the reinforcing plate 28 and the adhesive layer 26 include one in which a die attach film is formed on a surface of a Si plate, and one in which an adhesive is screen-printed on a Si plate. If the reinforcing plate 28 is made of Si, the reinforcing plate 28 has an advantage that the reinforcing plate 28 is easily processed and the reinforcing plate 28 is easily thinned.

Then, the reinforcing plate 28 that has been cut into an appropriate size is mounted on the protection device 18 by using a mounter such that the adhesive layer 26 is located between the protection device 18 and the reinforcing plate 28. Then, the adhesive layer 26 is solidified by a solidification process such as heating, such that the reinforcing plate 28 is fixed.

In this process, it is possible to mount the reinforcing plate 28 by using the mounter that is used when the electronic component 10a is mounted. In addition, if the electronic component 10a in which the thickness of the protection device 18 is previously increased is prepared, it is hard to increase the thickness of the photosensitive polyimide resin, and there is a problem that the cost is further increased. However, in the case of various preferred embodiments of the present invention, it is possible to fix the reinforcing plate 28 at a lower cost.

Figure 3D:
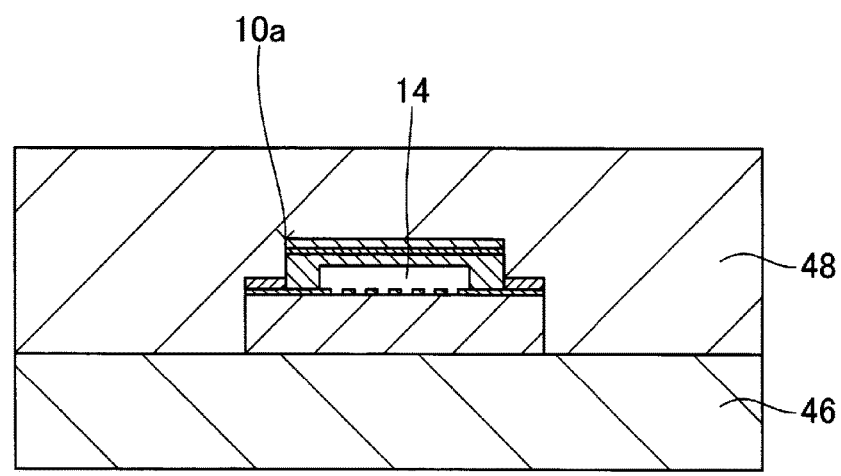
FIG. 3D is a cross-sectional view showing the method for manufacturing the electronic component module according to a preferred embodiment of the present invention and showing a continuation of FIGS. 2A-2C.

Next, as shown in FIG. 3D, the resin layer 48 is formed on the principal surface of the common substrate 46 on which the electronic component 10a is fixed. At that time, the resin layer 48 is formed so as to contain the electronic component 10*a*. Examples of a method for forming the resin layer 48 include laminate and a resin molding method. At that time, the space 14 is prevented from collapsing due to the presence of the reinforcing plate 28.

At the last, although not shown, the common substrate may be divided and individual electronic component modules may be taken out. In this manner, the electronic component module is produced.

It should be noted that in the present preferred embodiment, the electronic component 10*a* and the land are connected to each other via the wire, but may be connected to each other by another connection method such as flip chip bonding.

Second Preferred Embodiment

Figure 4:
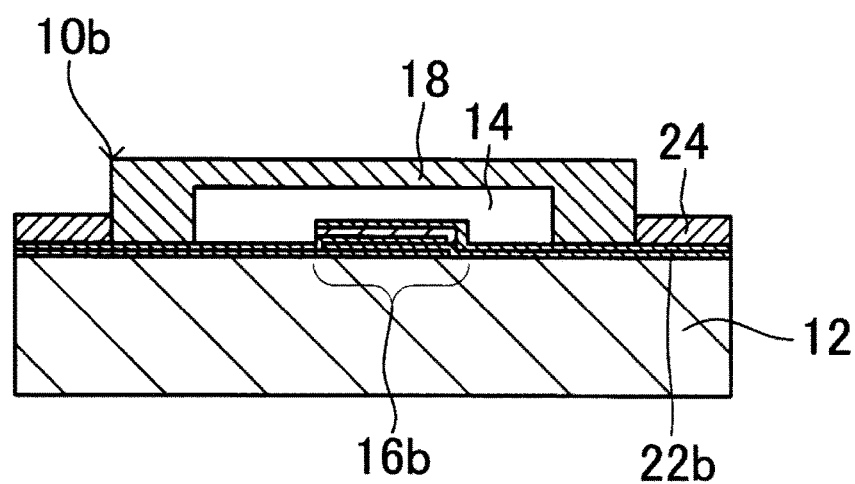
FIG. 4 is a cross-sectional view showing an electronic component used in a preferred embodiment of the present invention.

FIG. 4 is a cross-sectional view showing an electronic component used in a preferred embodiment of the present invention, and is an example where the electronic component is a BAW element. A drive device and some of wires are omitted.

When an electronic component 10*b* is a BAW element, an element substrate 12 is an insulating substrate of Si or the like, and a drive device 16*b* includes a piezoelectric thin film on both surfaces of which electrodes are located. The drive device 16*b* is acoustically isolated from the element substrate 12 via an acoustic isolation layer. Alternatively, a void may be formed in the element substrate 12 instead of the acoustic isolation layer.

Third Preferred Embodiment

Figure 5:
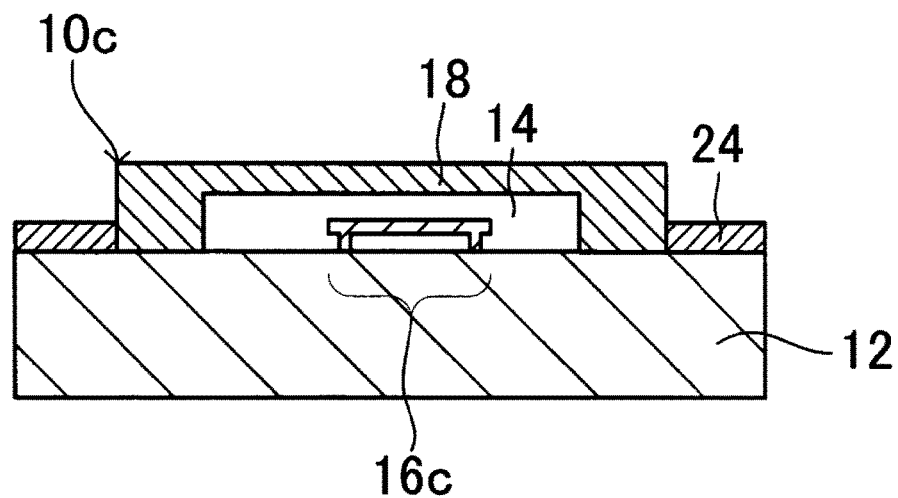
FIG. 5 is a cross-sectional view showing an electronic component used in a preferred embodiment of the present invention.
Figure 6:
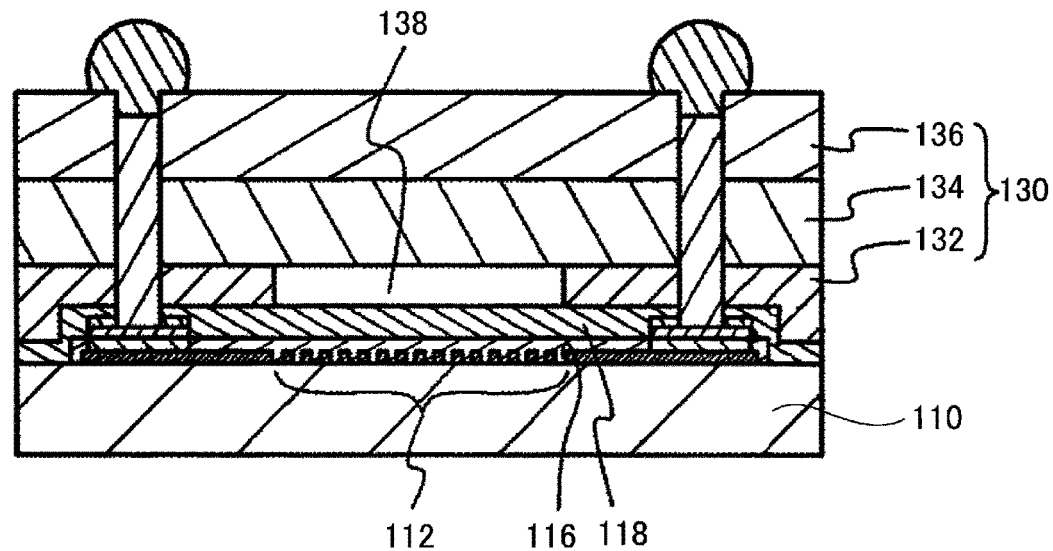
FIG. 6 is a cross-sectional view showing an existing electronic component.

FIG. 5 is a cross-sectional view showing an electronic component used in a preferred embodiment of the present invention, and is an example where the electronic component is an MEMS (Micro Electro Mechanical Systems) element. A drive device and some of wires are omitted.

When an electronic component 10*c* is an MEMS element, an element substrate 12 is an insulating substrate of Si or the like, and a drive device 16*c* includes a vibrating device made of Si. Then, the vibrating device is formed by MEMS processing.

It should be noted that the present invention is not limited to the above-described preferred embodiments, and it is possible to make various modifications without departing from the gist of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A method for manufacturing an electronic component module, the method comprising:

a step of preparing an electronic component including an element substrate, a drive device formed on a principal surface of the element substrate, and a protection device arranged so as to form a space around the drive device and cover the drive device;

a step of preparing a common substrate, and mounting and fixing the electronic component on the common substrate by using a mounter such that a principal surface of the common substrate and another principal surface of the element substrate face each other;

a step of mounting and fixing a reinforcing plate on the protection device of the electronic component by using a mounter; and a step of forming a resin layer on the principal surface of the common substrate such that the electronic component is contained therein.

2. The method for manufacturing the electronic component module according to claim 1, wherein, in the step of fixing the reinforcing plate, an adhesive layer is previously formed on a surface of the reinforcing plate, and the reinforcing plate is fixed such that the adhesive layer is located between the protection device and the reinforcing plate.

3. The method for manufacturing the electronic component module according to claim 1, wherein the reinforcing plate is made of Si.

4. The method for manufacturing the electronic component module according to claim 2, wherein the reinforcing plate is made of Si.

5. The method for manufacturing the electronic component module according to claim 1, wherein the element substrate is a piezoelectric substrate and the drive device includes an interdigital transducer electrode.

6. The method for manufacturing the electronic component module according to claim 2, wherein the element substrate is a piezoelectric substrate and the drive device includes an interdigital transducer electrode.

7. The method for manufacturing the electronic component module according to claim 3, wherein the element substrate is a piezoelectric substrate and the drive device includes an interdigital transducer electrode.

8. The method for manufacturing the electronic component module according to claim 4, wherein the element substrate is a piezoelectric substrate and the drive device includes an interdigital transducer electrode.

9. The method for manufacturing the electronic component module according to claim 1, wherein the element substrate is an insulating substrate and the drive device includes a piezoelectric thin film and electrodes formed on both surfaces of the piezoelectric thin film.

10. The method for manufacturing the electronic component module according to claim 2, wherein the element substrate is an insulating substrate and the drive device includes a piezoelectric thin film and electrodes formed on both surfaces of the piezoelectric thin film.

11. The method for manufacturing the electronic component module according to claim 3, wherein the element substrate is an insulating substrate and the drive device includes a piezoelectric thin film and electrodes formed on both surfaces of the piezoelectric thin film.

12. The method for manufacturing the electronic component module according to claim 4, wherein the element substrate is an insulating substrate and the drive device includes a piezoelectric thin film and electrodes formed on both surfaces of the piezoelectric thin film.

13. The method for manufacturing the electronic component module according to claim 1, wherein the element substrate is an insulating substrate and the drive device includes a vibrating element made of Si.

14. The method for manufacturing the electronic component module according to claim 2, wherein the element substrate is an insulating substrate and the drive device includes a vibrating element made of Si.

15. The method for manufacturing the electronic component module according to claim 3, wherein the element substrate is an insulating substrate and the drive device includes a vibrating element made of Si.

16. The method for manufacturing the electronic component module according to claim 4, wherein the element substrate is an insulating substrate and the drive device includes a vibrating element made of Si.

* * * * *